United States Patent
Schäufele

(10) Patent No.: US 11,180,364 B2
(45) Date of Patent: Nov. 23, 2021

(54) COVERING FOR A COMPONENT AND METHOD FOR PRODUCING A COVERING FOR A COMPONENT

(71) Applicant: SNAPTRACK, INC., San Diego, CA (US)

(72) Inventor: Ansgar Schäufele, Munich (DE)

(73) Assignee: SnapTrack, Inc., San Diego, CA (US)

( * ) Notice: Subject to any disclaimer, the term of this patent is extended or adjusted under 35 U.S.C. 154(b) by 226 days.

(21) Appl. No.: 15/508,820

(22) PCT Filed: Aug. 25, 2015

(86) PCT No.: PCT/EP2015/069453
§ 371 (c)(1),
(2) Date: Jun. 8, 2017

(87) PCT Pub. No.: WO2016/034456
PCT Pub. Date: Mar. 10, 2016

(65) Prior Publication Data
US 2017/0267519 A1    Sep. 21, 2017

(30) Foreign Application Priority Data

Sep. 3, 2014   (DE) .................... 102014112672.6

(51) Int. Cl.
*B81B 7/00*       (2006.01)
*H03H 9/10*     (2006.01)
(Continued)

(52) U.S. Cl.
CPC ............ *B81B 7/0058* (2013.01); *B32B 3/263* (2013.01); *B32B 3/28* (2013.01); *B81C 1/00333* (2013.01);
(Continued)

(58) Field of Classification Search
CPC .......... B81B 7/0058; B81B 2201/0271; H03H 3/007; H03H 3/08; H03H 9/1092;
(Continued)

(56) References Cited

U.S. PATENT DOCUMENTS 4,931,346 A * 6/1990 Nogueras Dardina .....................
 B32B 29/08
 428/182
5,407,714 A * 4/1995 Laves .................... B32B 29/08
 206/524.3
(Continued)

FOREIGN PATENT DOCUMENTS

CN    101513989 A    8/2009
CN    102196989 A    9/2011
(Continued)

OTHER PUBLICATIONS

International Search Report and Written Opinion—PCT/EP2015/069453—ISA/EPO—dated Dec. 9, 2015.

*Primary Examiner* — Michael Zhang

(57) ABSTRACT

The invention relates to a covering (1) for an electronic component (e.g. of the MEMS, BAW, or SAW type). The covering comprises at least one layer (5, 6, 7) having a structure (19, 20, 21) with a number of prominences (8, 9,
(Continued)

Figure 1A:
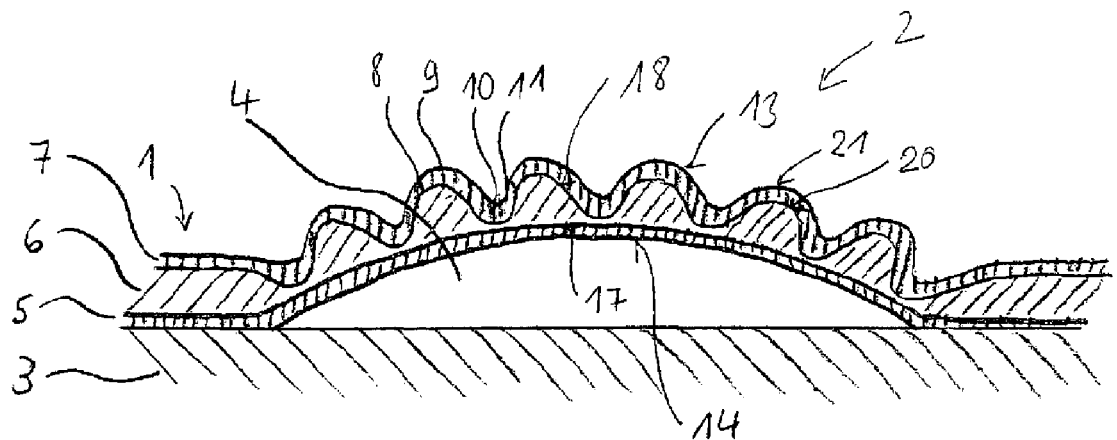

15) and/or depressions (10, 11, 16). The invention furthermore relates to a method for producing a covering (1) of this type.

13 Claims, 3 Drawing Sheets

(51) Int. Cl.
*B81C 1/00* (2006.01)
*H01L 23/04* (2006.01)
*B32B 3/26* (2006.01)
*B32B 3/28* (2006.01)
*H03H 3/007* (2006.01)
*H03H 3/08* (2006.01)

(52) U.S. Cl.
CPC ............ *H01L 23/04* (2013.01); *H03H 3/007* (2013.01); *H03H 3/08* (2013.01); *H03H 9/105* (2013.01); *H03H 9/1092* (2013.01); *B32B 2307/50* (2013.01); *B32B 2457/00* (2013.01); *B81B 2201/0271* (2013.01); *B81C 2203/0136* (2013.01); *B81C 2203/0163* (2013.01); *H01L 2924/0002* (2013.01); *H03H 2003/0071* (2013.01)

(58) Field of Classification Search
CPC .. H03H 9/105; H03H 2003/0071; B32B 3/28; B32B 3/263; B32B 2457/00; B32B 2307/50; B32B 29/08; H01H 23/04; H01H 2924/0002; B81C 1/00333; B81C 2203/0136; B81C 2203/0163
See application file for complete search history.

(56) References Cited

U.S. PATENT DOCUMENTS

| | | | | |
|---|---|---|---|---|
| 6,066,691 | A | * | 5/2000 | Sobottka ................ C08J 3/226 524/450 |
| 6,087,638 | A | * | 7/2000 | Silverbrook ......... B41J 2/14427 219/201 |
| 2002/0141712 | A1 | * | 10/2002 | O'Connor ............ G02B 6/4435 385/107 |
| 2004/0061207 | A1 | * | 4/2004 | Ding ..................... B81B 7/0038 257/678 |
| 2005/0012040 | A1 | | 1/2005 | Fiorini et al. |
| 2009/0179287 | A1 | | 7/2009 | Inaba |
| 2009/0194309 | A1 | * | 8/2009 | Gillot ...................... B81B 3/007 174/50 |
| 2009/0304999 | A1 | * | 12/2009 | Fascio .................. B65D 65/403 428/159 |
| 2010/0094653 | A1 | | 4/2010 | Tribble et al. |
| 2011/0062826 | A1 | | 3/2011 | Umeki et al. |
| 2014/0231934 | A1 | | 8/2014 | Saito |
| 2015/0284242 | A1 | * | 10/2015 | Saito .................... B81B 7/0054 257/415 |
| 2017/0297905 | A1 | * | 10/2017 | Saxena .................... B81B 7/02 |

FOREIGN PATENT DOCUMENTS

| | | | | |
|---|---|---|---|---|
| DE | 2418794 | A1 | 11/1975 | |
| EP | 1251099 | A2 | 10/2002 | |
| EP | 1640329 | A2 | 3/2006 | |
| JP | 2006501679 | A | 1/2006 | |
| JP | 2009184102 | A | 8/2009 | |
| JP | 2009537344 | A | 10/2009 | |
| JP | 2014155980 | A | 8/2014 | |
| WO | WO-9909070 | A1 * | 2/1999 | ................ C08F 2/44 |
| WO | WO-2010049837 | A2 | 5/2010 | |

* cited by examiner

COVERING FOR A COMPONENT AND METHOD FOR PRODUCING A COVERING FOR A COMPONENT

Covering for a component and method for producing a covering for a component

A covering for a component is specified. For example, the component has a component structure that is designed as an MEMS (microelectromechanical system), BAW, or SAW structure. In particular, a component in package form is prepared via the structure provided with the covering. The covering is preferably produced in a thin-film technology. Furthermore, a method for producing such a covering is specified.

For example, a covering of an electrical component serves to protect a component structure from mechanical and/or chemical influences. In addition, a defined hollow space for the component structure is formed by the covering. A method for producing a covering arises from the publication DE 10 2011 103 516 A1.

It is an object of the present invention to specify an improved covering and a method for producing an improved covering for a component structure.

According to a first aspect of the present invention, a covering for a component is specified. The covering is preferably produced in a thin-film technology. For example, the component has a component structure that is to be covered. For example, the component structure is a filter and/or duplexer structure. In particular, it may be one or more resonators, for example cascaded resonators.

The covering preferably has a bottom side that faces the component structure, and a top side that faces away from the component structure. The exterior space of the component adjoins the top side. For example, the component structure and the covering are arranged on a carrier substrate. The bottom side is thus the side of the covering that faces the carrier substrate, and the top side is the side that faces away from the carrier substrate. For example, the covering delimits a hollow space. The bottom side preferably directly adjoins the hollow space.

The covering comprises at least one layer that has a structure. In particular, the layer has a number of prominences and/or depressions. For example, the prominences and/or depressions are arranged in a regular structure.

The mechanical stability of the covering is preferably increased by such a structure. For example, this allows for an enlargement of the footprint of the covering. Furthermore, such a stable covering also allows the application of an additional casting compound under high injection pressure. Furthermore, a smaller thickness of the covering is possible. Among other things, this leads to cost savings. Furthermore, a large thickness of the covering may lead to an unwanted curvature of the wafer.

In one embodiment, the prominences and/or depressions are formed both on a top side and on a bottom side of a layer of the covering. In doing so, the thickness of the layer is constant, for example, over the entire surface of the layer. The bottom side and top side of a layer are accordingly defined in the same manner as the bottom side and top side of the entire covering with regard to the orientation relative to the component structure or to the carrier substrate.

In one embodiment, the prominences and/or depressions are formed only on a top side or only on a bottom side of the layer. For example, the thickness of the layer at the site of the prominences differs from the thickness of the layer at other locations. For example, the layer is thicker at the site of a prominence than at other locations. At the site of a depression, the layer is thinner than at other locations, for example.

In one embodiment, the prominences and/or depressions have an elongated shape. In particular, in a top view of the covering, the prominences and/or depressions are formed to be markedly longer in one direction than in a direction orthogonal thereto. The prominences and/or depressions preferably extend along a common direction. For example, the prominences are arranged at regular intervals in a direction orthogonal to the longitudinal direction. In one embodiment, the layer has a wave shape. The prominences may in particular lead to a wavy or corrugated surface structure of the layer.

In one embodiment, the layer has a sinusoidal outer contour in cross section. In further embodiments, the outer contour extends in a trapezoid or triangle shape. For example, the prominences are formed in a zigzag shape, or in a zigzag shape with a capped point.

The structure may also be formed as neither a corrugation nor a wave shape. For example, the structure is formed similarly to an egg carton.

In one embodiment, the covering has a number of layers arranged on top of one another. The structure is in this case formed in at least one of the layers. For example, the covering has a bottommost layer and a topmost layer. The bottom side of the bottommost layer in this case forms the bottom side of the covering. The top side of the topmost layer forms the top side of the covering.

In one embodiment, the covering has a bottommost layer, at least one middle layer, and a topmost layer. The covering is thus formed of at least three layers. A number of middle layers may also be arranged between the topmost and bottommost layer. For example, the middle layer forms a support layer. For example, the material of the middle layer has a relatively low inherent rigidity in comparison to the topmost and bottommost layer. For example, the bottommost layer comprises a silicon oxide, the middle layer comprises a polymer, and the topmost layer comprises a silicon nitride.

In one embodiment, the structure is formed at least on the bottom side of the covering. For example, such a structure is generated by a corresponding structure of a sacrificial material. A sacrificial material, in particular a sacrificial layer, is in this case applied onto a carrier substrate. For example, the sacrificial material covers a component structure. For example, the sacrificial material is applied onto the carrier substrate by means of a lithographic process. A structure of the sacrificial material may also be generated in the process. In particular, depressions and/or prominences may be formed on the top side of the sacrificial material. A layer—in particular the bottommost layer—of the covering is subsequently applied onto the sacrificial material. Due to the structure of the sacrificial material, the covering receives a complementary structure on its bottom side. The sacrificial material is preferably removed after the application of the layer.

In an alternative embodiment, the bottom side of the covering is free of the structure. For example, the bottom side has a smooth surface. However, the bottom side may also have breakthroughs or similar structures that are not formed to increase the mechanical stability. An embodiment in which the bottom side has no structure has the advantage that the structure does not alter the geometry of the hollow space. An effect on the functionality of the component may thus be avoided.

In one embodiment, the structure is formed on the top side of the covering. For example, for this purpose, a middle and/or topmost layer of the covering is applied by means of a lithographic process, wherein the structure may also be generated in this process. The structure of a topmost layer may also occur as a result of a structure of an underlying layer. In particular, the structure of the topmost layer may be complementary to the structure of a middle layer.

In an alternative embodiment, the top side of the covering is free of the structure. For example, the top side has a smooth surface. For example, this has the advantage that the structure is less susceptible to external damage. For example, a structure of a layer is in this case smoothed by an overlying layer.

In one embodiment, the covering has a combination of a number of structures. For example, both the top side and the bottom side of the covering are provided with a structure. For example, the covering has a number of layers that are respectively provided with a structure.

Given a number of structures, the structures may differ in their geometry and/or their orientation. For example, a structure has elongated prominences and/or depressions that extend along a first direction. An additional structure likewise has elongated prominences and/or depressions that, however, extend along a second direction. The first direction differs from the second direction. For example, the directions extend orthogonally to one another. The structures may be formed on a top side and a bottom side of a layer. As an alternative or in addition thereto, the structures may be formed in different layers.

In one embodiment, both the top side and the bottom side of the covering are free of a structure. In this case, the covering is formed in a number of layers, for example. Given a two-layer design, for example, the structure may be formed only on the bottom side of the topmost layer and/or the top side of the bottommost layer. Given a three-layer or multilayer design, for example, a middle layer has have the structure.

According to a further aspect of the present invention, an intermediate product for a component having a covering is specified. The covering is formed as described above. The intermediate product has a sacrificial layer that adjoins the bottom side of the covering. The sacrificial layer is provided to be at least partially removed in a later method step. The sacrificial layer has on its top side at least one structure having a number of prominences and/or depressions.

For example, in the production of the intermediate product, the sacrificial layer having a structure is first applied onto a carrier substrate. For example, a lithographic process is used for this purpose. The covering is subsequently applied onto the sacrificial layer. The covering preferably receives its structure as a result of the structure of the sacrificial layer.

According to a further aspect of the present invention, a component having a covering is specified. The covering is formed as described above. The component additionally has a component structure that is covered by the covering. For example, the component structure is a structure of an MEMS, SAW, and/or BAW component. For example, the component structure is formed as part of a filter or duplexer. It may also be a unit, for example a filter unit or duplexer unit.

The mechanical stability of the covering, which stability is increased by the structure, enables it to cover larger component structures. Due to the allowed larger footprint of the covering, fewer individual parts of a unit now need to be provided with a separate covering. This leads to a space savings, and thus allows for an additional miniaturization of the component. Moreover, a lower complexity of the component is made possible.

According to a further aspect of the present invention, a method for producing a covering for a component is specified. A carrier substrate is in this case provided. For example, it is a carrier substrate at the wafer level that is later individualized into a number of components. One or more component structures may be arranged on the carrier substrate. At least one layer is applied onto the carrier substrate. A structure is subsequently introduced into the layer. The structure has a number of prominences and/or depressions. One or more additional layers may be applied onto the structured layer.

In one embodiment, the structured layer is a sacrificial layer that is entirely or partially removed in a later method step. For example, a layer of the covering is applied onto the structured sacrificial layer. The layer of the covering receives its structure via the structure of the sacrificial layer.

In one embodiment, a sacrificial layer is applied that has no structure on the top side. A bottommost layer of the covering is applied onto the sacrificial layer. For example, this bottommost layer has a structure, in particular on the top side.

According to one embodiment of the method, an additional layer of the covering is applied onto the bottommost layer of the covering. The additional layer may be formed such that the top side of the additional layer is free of the structure. For example, the additional layer is formed such that depressions in the bottommost layer are filled. In one embodiment, an additional smoothing of the top side of the additional layer may take place.

A number of aspects of an invention are described in the present disclosure. All properties that are disclosed with regard to the covering, the intermediate product, the component, and the method are also accordingly disclosed with regard to the respective other aspects, and vice versa, even if the respective property is not explicitly mentioned in the context of the respective aspect.

In the following, the subject matters described here are explained in more detail using schematic exemplary embodiments that are not true to scale.

Figure 1B:
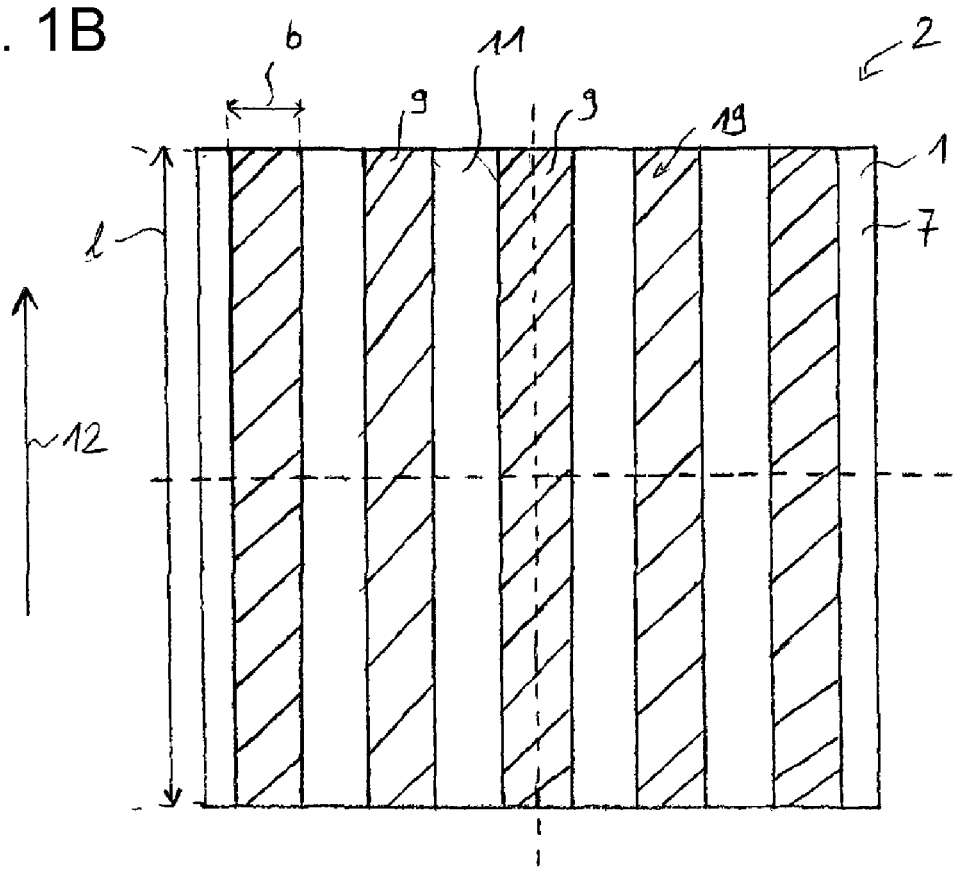

Shown are:

FIG. 1A in schematic cross section, a first embodiment of a covering,

FIG. 1B in top view, the covering from FIG. 1A,

FIGS. 2 through 5 in schematic cross sections, additional embodiments of a covering.

In the following Figures, the same reference characters preferably refer to functionally or structurally corresponding parts of the various embodiments.

FIG. 1A shows a covering 1 for a component 2 in a cross section. FIG. 1B shows the covering 1 in a top view. The component 2 is formed as an MEMS, BAW, or SAW component, for example.

The covering 1 is applied onto a carrier substrate 3 and, with the carrier substrate 3, encloses a hollow space 4. One or more component structures (not depicted) may be arranged in the hollow space 4. For example, these are component structures for a filter and/or duplexer. In particular, the component structures may comprise one or more resonators. However, the component structures may also be of a different type. The covering 1 encapsulates the component structure, for example; in particular, a hermetic encapsulation may exist. The component 2 is provided with the covering 1, for example in package form.

The covering has a number of layers 5, 6, 7. A bottommost layer 5 directly adjoins the hollow space 4. For example, the bottommost layer comprises a silicon oxide. A middle layer 6 comprises a polymer, for example. A topmost layer 7 forms the outer end of the component. For example, the topmost layer 7 comprises a silicon nitride. The bottommost and topmost layers 5, 7 are relatively hard in comparison to the middle layer 6, for example. For example, the middle layer 6 acts as a support layer.

At least one of the layers 5, 6, 7 of the cover 1 is provided with a structure 20, 21. The structure 20, 21 serves to increase the stability of the covering 1. In particular, the stability may be increased by a structure 20 of the middle layer 6. The bottommost and/or topmost layer 5, 7 have, for example, structures complementary to the structure 20 of the middle layer 6.

In the embodiment shown in FIGS. 1A and 1B, the middle layer 6 and the topmost layer 7 respectively have a structure 20, 21 with elongated prominences 8, 9. Analogously, the middle layer 6 and the topmost layer 7 have depressions 10, 11 that are formed between the prominences 8, 9. The middle layer 6 has the structure 20 on its top side 18. The bottom side 17 of the middle layer 6 has no structure.

The prominences 9 in the topmost layer 7 form prominences on the top side 13 of the covering 1. The top side 13 of the covering 1 corresponds to the top side of the topmost layer 7.

The prominences 8, 9 are arranged regularly and have a uniform geometry. In particular, the lengths 1 and the widths b of the prominences 8, 9 are similar or identical. The prominences 8, 9 extend along a common direction 12. Due to the prominences 8, 9, the middle and upper layer 6, 7 receive a wavy structure.

The prominences 8, 9 lead to an increase in the mechanical stability of the covering 1 in a similar way as in a corrugated sheet roof of a building or in a corrugated board. This allows for the thickness of the covering 1 to be kept low with sufficient stability. In particular, coverings 1 formed with a large footprint may also be used without the thickness of the covering 1 needing to be increased. For example, this allows for an entire filter and/or duplexer unit to be provided with a single, large covering, instead of providing individual parts, for example one or more resonators, with a number of separate coverings.

For example, the component structure and/or component arrangement that is to be covered has an elongated shape in top view. In this case, for example, the prominences 8, 9 extend orthogonally to the longitudinal direction of the component arrangement. The prominences 8, 9 may also not have an elongated shape. For example, the structure is formed as in an egg carton. For example, this is advantageous given a component structure or component arrangement that has no long side, for example is of a quadratic design.

For example, the prominences 8, 9 extend nearly across the entire surface of the covering 1. In another embodiment, the covering 1 may be provided with the prominences 8, 9 only on a portion of its surface.

The bottommost layer 5 is free of prominences. In particular, the bottom side 14 of the covering that is formed by the side of the bottommost layer 5 that faces the hollow space 4 has a smooth surface. In particular, the bottom side 14 has no prominences or depressions. The prominences 8, 9 thus do not affect the shape of the hollow space 4.

The covering 1 is preferably produced in a thin-film technology. For example, to form the covering 1, a sacrificial layer is first applied onto the carrier substrate 3. In the depicted embodiment, the sacrificial layer has a smooth top side.

The bottommost layer 5 is applied onto the sacrificial layer. For example, the sacrificial layer is subsequently entirely or partially removed. To remove the sacrificial layer, an opening may be formed in the bottommost layer 5. The middle layer 6 is applied onto the bottommost layer 5. The opening in the bottommost layer 5 may be sealed by the middle layer 6. The middle layer 6 is applied by means of a lithographic process, for example, and is thereby structured. For example, a greyscale mask is used. The greyscale mask may in this case have very fine holes that are not dissolved. Depending on the formation of the holes, the structure 20 may have more or less steep sides.

Finally, the topmost layer 7 is applied onto the middle layer 6. The topmost layer 7 receives its structure 21 via the structure 20 of the middle layer 6 such that a complementary structure 21 is formed.

Figure 2:
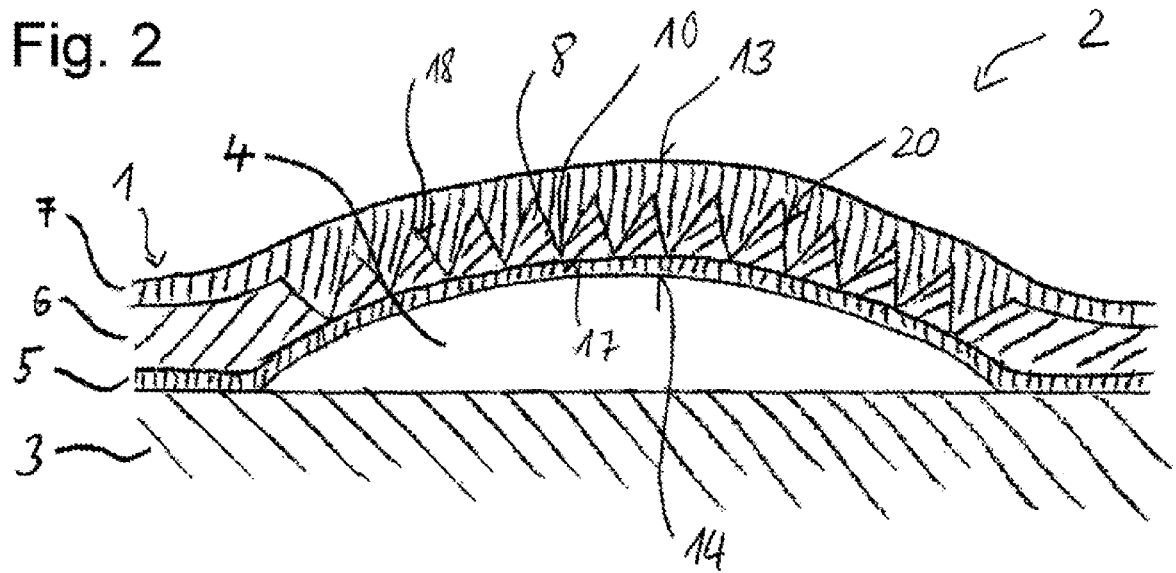

FIG. 2 shows an additional embodiment of a covering 1. Here as well, the covering 1 comprises three layers 5, 6, 7. However, in contrast to the embodiment from FIG. 1A, the structure 20 is not externally visible here.

The middle layer 6 has on its top side 18 a structure 20 with prominences 8 or depressions 10. The structure 20 is formed in a zigzag shape. The bottom side of the topmost layer 6 is formed complementarily to the top side 18, meaning that it likewise has a zigzag-shaped structure.

The top side 13 of the covering 1 that is formed by the top side of the topmost layer 7 is formed smoothly. In particular, no prominences or depressions are present on the top side 13. For example, the topmost layer 7 is applied such that the depressions in the middle layer 6 are completely filled with the material of the topmost layer 7. The topmost layer 7 may additionally be externally smoothed.

A combination of features of the coverings from FIGS. 1A and 2 is also possible. For example, a wavy structure may be present in one or more layers 5, 6, 7 of the covering 1 according to FIG. 1A, wherein the top side 13 of the covering 1 is formed smoothly as in FIG. 2. On the other hand, a zigzag structure 20 according to FIG. 2 may also be present, and a complementary structure 21 may be formed on the top side 13. The structure 20 may also be of zigzag shape in the middle layer 6 and transition into a wavy structure 21 on the top side 13.

Figure 3:
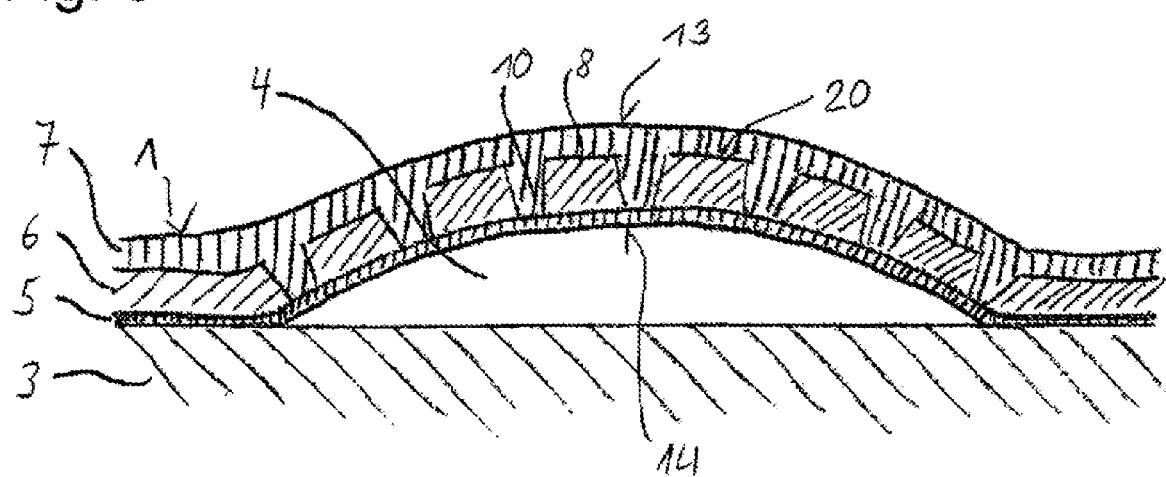

FIG. 3 shows an additional embodiment of a covering 1. Here as well, the top side 13 and bottom side 14 of the covering 1 are formed smoothly. The embodiment differs from the embodiment from FIG. 2 in the shape of the structure of the middle layer 6.

The middle layer 6 has elongated prominences 8 with a trapezoidal cross section. The base of the trapezoid is longer than the side opposite it. In another embodiment, the base may also be shorter than or of the same length as the opposite side.

Depressions 10 are formed between the prominences 8. The depressions 10 form clearances in the middle layer 6 and extend to the bottommost layer 5. The prominences 9 of the middle layer 6 are thus not connected with one another. The depressions 10 are completely filled by the material of the topmost layer 7.

Figure 4:
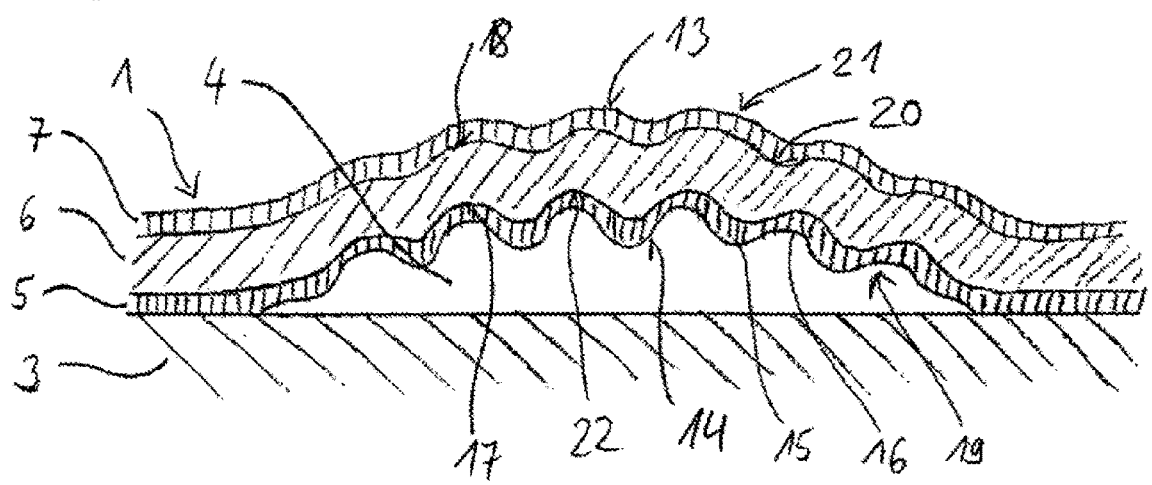

FIG. 4 shows an additional embodiment of a covering 1. In contrast to the embodiments shown in FIGS. 1A through 3, the bottom side 14 of the covering has a structure 19. In particular, prominences 15 and depressions 16 are present on the bottom side 14. The structure 19 is of wavy shape. However, a different shape of the structure may also be present. The structure 19 on the bottom side 14 is generated by a sacrificial layer structured on the top side, for example. The bottommost layer 5 thus receives a complementary structure 19. The middle layer likewise receives complementary structures 22, 20 on its bottom side 17 and its top side 18. The top side 13 of the covering 1 is likewise structured in a complementary manner, in particular in a wave shape.

Figure 5:
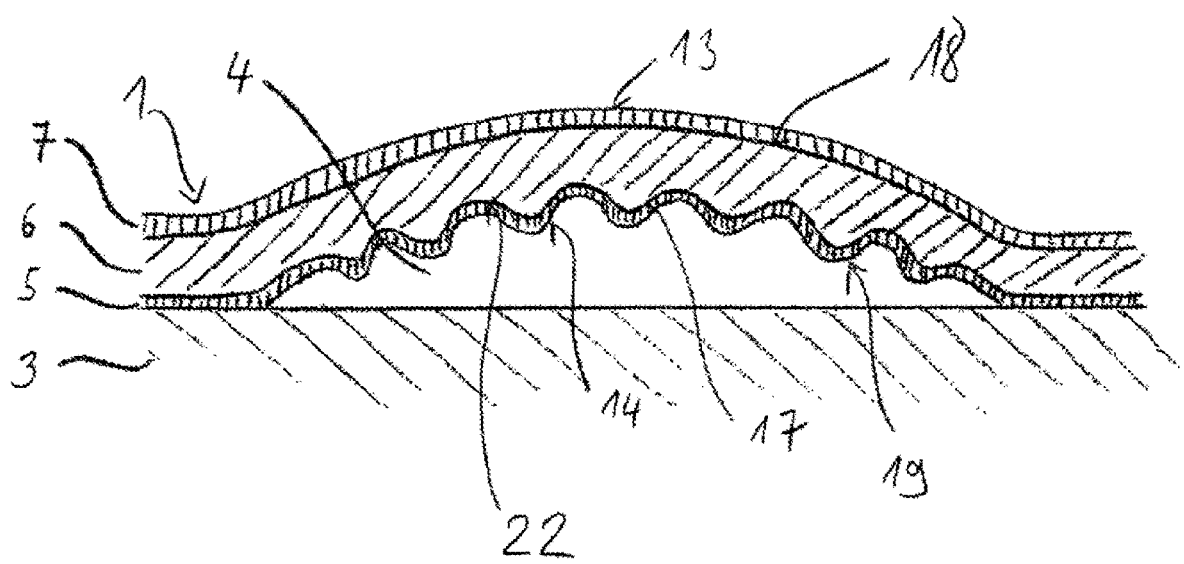

FIG. 5 shows an additional embodiment of a covering 1 in which a structure 19 is present on the bottom side 14 of the covering 1. In contrast to FIG. 4, the top side 13 of the covering 1 is formed smoothly.

The middle layer 6 has a structure 22 only on its bottom side 17. The top side 18 of the middle layer 6 is formed smoothly. The geometry of the topmost layer 7 is complementary to the geometry of the top side 18 of the middle layer 6. In particular, the topmost layer 7 has no structure and thus is formed smoothly on its top side and the bottom side. The geometry of the top side 13 of the covering is thus complementary to the geometry of the top side 18 of the middle layer 6.

In another embodiment, the top side 18 of the middle layer 6 may likewise have a structure analogously to the embodiments of FIGS. 2 and 3. The topmost layer 7 may completely fill the depressions and have a smooth top side such that the top side 13 of the covering 1 is formed smoothly.

In a further embodiment, various layers 5, 6, 7 of the covering may have different structures. For example, the bottommost layer 5 has on its bottom side 14 a structure 19 in which elongated prominences extend in a first direction. For example, the topmost layer 7 has on its top side 13 a structure 21 in which elongated prominences extend in a second direction that does not coincide with the first direction. For example, the second direction extends orthogonally to the first direction.

REFERENCE CHARACTER LIST 1 covering
2 component
3 substrate
4 hollow space
5 bottommost layer
6 middle layer
7 topmost layer
8 prominence
9 prominence
10 depression
11 depression
12 direction
13 top side of the covering
14 bottom side of the covering
15 prominence
16 depression
17 bottom side of the middle layer
18 top side of the middle layer
19 structure on the bottom side of the covering
20 structure on the top side of the middle layer
21 structure on the top side of the covering
22 structure on the bottom side of the middle layer
b width of the prominence
l length of the prominence

The invention claimed is:

1. An electronic component covering, comprising:
a bottommost layer;
at least one middle layer, having a structure comprising a number of prominences and a number of depressions; and
a topmost layer completely filling at least some of the number of depressions, wherein:
 a bottom side of the bottommost layer and a top side of the topmost layer are free of the structure;
 the electronic component covering configured to hermetically enclose a hollow space such that one or more electrical component structures may be arranged in the hollow space; and
 the bottom side of the bottommost layer directly adjoins the hollow space.

2. The electronic component covering according to claim 1, wherein the structure is in at least one of a corrugation form or a wave shape form.

3. The electronic component covering according to claim 1, wherein at least one of the number of prominences or the number of depressions have an elongated shape.

4. The electronic component covering according to claim 1, wherein the structure is configured to increase mechanical stability of the electronic component covering.

5. The electronic component covering according to claim 1, wherein the bottommost layer comprises silicon oxide.

6. The electronic component covering according to claim 1, wherein the at least one middle layer comprises a polymer.

7. The electronic component covering according to claim 1, wherein the topmost layer comprises silicon nitride.

8. The electronic component covering according to claim 1, wherein at least one of the topmost layer or the bottommost layer comprises silicon.

9. The electronic component covering according to claim 1, wherein the one or more electrical component structures comprise at least one of a filter, a duplexer, a resonator, or cascaded resonators.

10. An electronic component, comprising:
an electronic component structure; and
an electronic component covering that covers the electronic component structure, wherein the electronic component covering comprises:
 a bottommost layer;
 at least one middle layer, having a structure comprising a number of prominences and a number of depressions; and
 a topmost layer completely filling at least some of the number of depressions, wherein:
  a bottom side of the bottommost layer and a top side of the topmost layer are free of the structure;
  the electronic component covering delimits a hollow space;
  the bottom side of the bottommost layer directly adjoins the hollow space;
  one or more electrical component structures are arranged in the hollow space; and
  the one or more electrical components are hermetically encapsulated by the electronic component cover.

11. The electronic component according to claim 10, wherein the structure is in at least one of a corrugation form or a wave shape form.

12. The electronic component according to claim 10, wherein at least one of the number of prominences or the number of depressions have an elongated shape.

13. The electronic component according to claim 10, wherein the structure is configured to increase mechanical stability of the electronic component covering.

* * * * *